(12) United States Patent
Narukawa et al.

(10) Patent No.: US 7,348,600 B2
(45) Date of Patent: Mar. 25, 2008

(54) NITRIDE SEMICONDUCTOR DEVICE, AND ITS FABRICATION PROCESS

(75) Inventors: Yukio Narukawa, Anan (JP); Isamu Niki, Anan (JP); Axel Scherer, Pasadena, CA (US); Koichi Okamoto, Pasadena, CA (US); Yoichi Kawakami, 665-6, Shimogasa-cho, Kusatsu-shi, Shiga 525-0029 (JP); Mitsuru Funato, 48-3, Katsura-hitsujisaru-cho, Nishikyo-ku, Kyoto-shi, Kyoto 615-8084 (JP); Shigeo Fujita, 47-35, Shimazu, Momoyama-cho, Fushimi-ku, Kyoto-shi, Kyoto 612-0854 (JP)

(73) Assignees: Nichia Corporation, Tokushima (JP); Yoichi Kawakami, Shiga (JP); Mitsuru Funato, Kyoto (JP); Shigeo Fujita, Kyoto (JP); California Institute of Technology, Pasadena, CA (US)

( * ) Notice: Subject to any disclaimer, the term of this patent is extended or adjusted under 35 U.S.C. 154(b) by 55 days.

(21) Appl. No.: 10/687,768

(22) Filed: Oct. 20, 2003

(65) Prior Publication Data

US 2005/0082544 A1  Apr. 21, 2005

(51) Int. Cl.
*H01L 21/15* (2006.01)
(52) U.S. Cl. .......................... 257/79; 257/94; 257/103; 257/E31.058
(58) Field of Classification Search .................. 257/94, 257/11, 12, 13, 79, 80, 81, 85, 103, 97, 96, 257/98, E31.058, E33.001, 95; 438/22, 24
See application file for complete search history.

(56) References Cited

U.S. PATENT DOCUMENTS

| 5,814,839 | A | * | 9/1998 | Hosoba | ....................... 257/96 |
| 6,229,151 | B1 | | 5/2001 | Takeuchi et al. | |
| 6,285,698 | B1 | * | 9/2001 | Romano et al. | ......... 372/46.01 |
| 6,388,275 | B1 | * | 5/2002 | Kano | ......................... 257/94 |

FOREIGN PATENT DOCUMENTS

| JP | 9-331116 | 12/1997 |
| JP | 2001-28458 | 1/2001 |

* cited by examiner

OTHER PUBLICATIONS

P. Waltereit et al., "Nitride semiconductors free of electrostatic fields for efficient white light-emitting diodes", Nature, vol. 406, Aug. 24, 2000, pp. 865-868.

*Primary Examiner*—Wai-Sing Louie
*Assistant Examiner*—(Vikki) Hoa B Trinh
(74) *Attorney, Agent, or Firm*—Volentine & Whitt, PLLC

(57) ABSTRACT

The invention provides a nitride semiconductor light-emitting device comprising gallium nitride semiconductor layers formed on a heterogeneous substrate, wherein light emissions having different light emission wavelengths or different colors are given out of the same active layer. Recesses 106 are formed by etching in the first electrically conductive (n) type semiconductor layer 102 formed on a substrate with a buffer layer interposed between them. Each recess is exposed in plane orientations different from that of the major C plane. For instance, the plane orientation of the A plane is exposed. An active layer is grown and joined on the plane of this plane orientation, on the bottom of the recess and the C-plane upper surface of a non-recess portion. The second electrically conductive (p) type semiconductor layer is formed on the inner surface of the recess. With the active layer formed contiguously to the semiconductor layer in two or more plane orientations, a growth rate difference gives rise to a difference in the thickness across the quantum well (active layer), giving out light emissions having different light emission wavelength peaks or different colors.

14 Claims, 11 Drawing Sheets

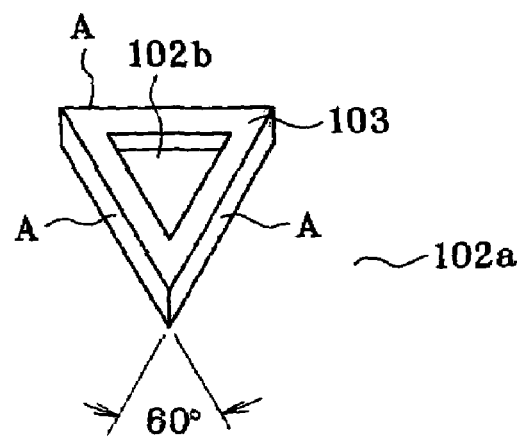
FIG. 2(a)
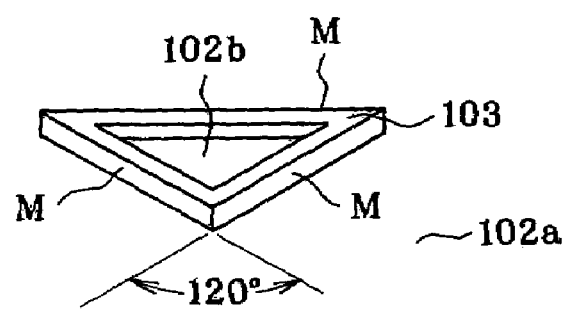
FIG. 2(b)
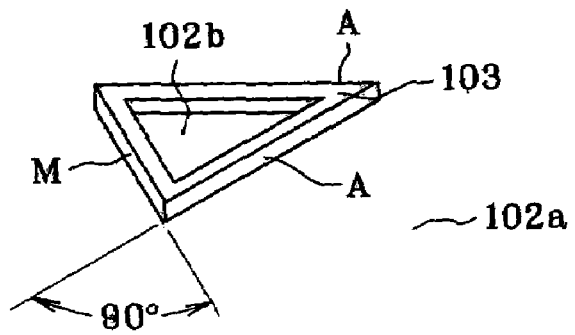
FIG. 2(c)
FIG. 3
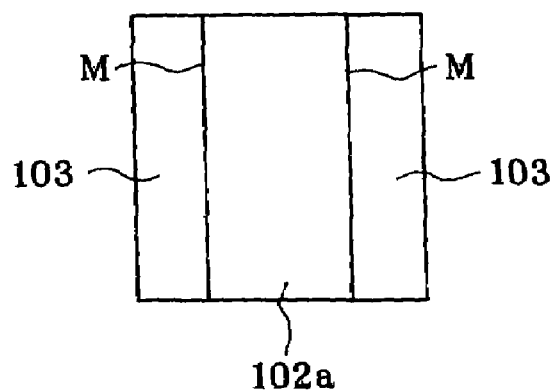

C Plane of sapphire substrate
C Axis
M Plane of sapphire substrate
A Plane of sapphire substrate
○ Position of oxygen
● Position of Al C Plane of sapphire substrate and GaN layer
C Axis
A Plane of GaN layer
M Plane of GaN layer
○ Position of oxygen
● Position of Al or N of GaN

NITRIDE SEMICONDUCTOR DEVICE, AND ITS FABRICATION PROCESS

BACKGROUND OF THE INVENTION

1. Field of the Invention

The present invention relates generally to a nitride semiconductor device comprising a gallium nitride semiconductor layer and its fabrication process, and more particularly to a nitride semiconductor device comprising a gallium nitride semiconductor layer formed on a heterogeneous substrate, wherein light is emitted in a plurality of colors having different light emission wavelengths from an active layer.

2. Related Art

In recent years, nitride semiconductor devices comprising gallium nitride semiconductor layers have been put to diverse uses and available in every aspect of daily life as light-emitting diodes (LEDs) emitting light in various colors and wavelengths such as blue light, green light, white light and ultraviolet light. In particular, white LEDs have high promise for the coming generation of lighting systems superseding fluorescent lamps.

In widespread nitride semiconductor devices comprising gallium nitride semiconductor layers, the first conduction (n) type gallium nitride semiconductor, an active layer and the second conduction (p) type gallium nitride semiconductor layer are stacked on the C plane of a sapphire substrate. The reason such nitride semiconductor devices have wide applications is that gallium nitride is grown on the sapphire C plane with relative ease, so that the crysallinity of gallium nitride is improved. To put nitride semiconductor devices comprising such gallium nitride semiconductor layers to practical use, it is of vital importance that the crystallinity of gallium nitride is satisfactory. The then used gallium nitride has a wurtzite crystal structure, and the growth plane for gallium nitride is the C plane.

As the nitride semiconductor light-emitting devices have wide applications as described above, the attention of users is directed to improvements in the light emission outputs of nitride semiconductor devices and light emissions of different light emission wavelengths from a single nitride semiconductor device. In efforts to address such requests, it has been proposed to fabricate unique light sources by adding some contrivances to the construction of an active layer.

JP-A 9-331116 teaches that asperities are formed on the surface of an indium (In)-containing quantum well active layer so that carriers are confined in the interface between the active layer and a clad layer in both the longitudinal and lateral directions, producing a quantum box effect. The publication then says that a plurality of light emission peaks appear at an interval of 1 meV to 100 meV in emission spectra from the light-emitting device, contributing to improvements in light emission outputs. JP-A 2001-28458 teaches that a multiple quantum well structure having a first well layer and a second well layer is formed in a longitudinal direction to substrate, so that light emissions having different light emission wavelengths or colors are obtained from the respective well layers. In this case, blue light is emitted from the first well layer near an n-type clad layer, and yellow light is emitted from the second well layer near a p-type clad layer.

The nitride semiconductor light-emitting device set forth in JP-A 9-331116 allows a plurality of light emission peaks to appear through the asperities formed on the active layer. However, this arrangement is basically designed to improve the light emission output of the same color; in other words, it is not designed to give out light emissions of different colors. A problem with this light-emitting device is that when used alone, it is not possible to give out light emissions having different light emission wavelengths or colors. On the other hand, the nitride semiconductor light-emitting device set forth in JP-A 2001-28458 is designed to obtain light emissions having different light emission wavelengths or colors. For the multiple quantum well structure with the first and second well layers stacked together, however, the well layers for giving out light emissions of different light emission wavelengths should be located with a barrier layer interposed between them, offering a problem that there is an increased space in the stacking direction.

In view of such problems, one object of the invention is to provide a nitride semiconductor device comprising gallium nitride semiconductor layers formed on a heterogeneous substrate, wherein light emissions having different light emission wavelengths or colors are given out of an active layer and mixed together to obtain light emissions of various colors.

SUMMARY OF THE INVENTION

The nitride semiconductor device and the nitride semiconductor device fabrication process of the invention are embodied as follows.

(1) A semiconductor light-emitting device, comprising a substrate and a first electrically conductive type semiconductor layer or layers, an active layer and a second electrically conductive type semiconductor layer or layers stacked on a major surface of the substrate, characterized in that:

a major surface of the first electrically conductive type semiconductor layer is provided with a recess, and the first electrically conductive type semiconductor layer is contiguous to the active layer formed within and without said recess in two or more plane orientations.

(2) The semiconductor light-emitting device according to (1), characterized in that said semiconductor layers and said active layer are each a gallium nitride semiconductor layer.

(3) The semiconductor light-emitting device according to (1), characterized in that the first electrically conductive type is an n-type and the second electrically conductive type is a p-type.

(4) The semiconductor light-emitting device according to (1), characterized in that said active layer has a quantum well structure including a well layer comprising an In-containing gallium nitride semiconductor.

(5) The semiconductor light-emitting device according to (1), characterized in that at least one of surfaces of the first electrically conductive semiconductor layer contiguous to the active layer defines the major surface of the first electrically conductive type semiconductor layer.

(6) The semiconductor light-emitting device according to (1), characterized in that at least one of surfaces of the first electrically conductive type semiconductor layer contiguous to the active layer is a surface vertical to the major surface of the first electrically conductive type semiconductor layer.

(7) The semiconductor light-emitting device according to (1), characterized in that the major surface of the first electrically conductive type semiconductor layer is a C plane of the gallium nitride semiconductor.

(8) The semiconductor light-emitting device according to (6), characterized in that the surface vertical to the major surface of the first electrically conductive type semiconductor layer is an A or M plane of the gallium nitride semiconductor.

(9) The semiconductor light-emitting device according to (8), characterized in that said active layer comprises a plurality of continuous M or A planes that make an angle of 30°, 60°, 90°, 120°, 150°, 210°, 240°, 270', 300° or 330°, as viewed from an upper surface of the first electrically conductive type semiconductor layer having a recess.

(10) The semiconductor light-emitting device according to (8), characterized in that said active layer has a striped M or A plane, as viewed from an upper surface of the first electrically conductive type semiconductor layer having a recess.

(11) The semiconductor light-emitting device according to (1), characterized in that said active layer comes in contact with the second electrically conductive type semiconductor layer in a plane orientation contiguous to the first electrically conductive type semiconductor layer.

(12) The semiconductor light-emitting device according to (1), characterized in that a first electrode is formed on at least a part of a surface of the first electrically conductive type semiconductor layer, said surface being exposed by etching of the second electrically conductive type semiconductor layer and said active layer, and a second electrode is formed on at least a part of a surface of the second electrically conductive type semiconductor layer.

(13) The semiconductor light-emitting device according to (1), characterized in that said active layer gives out light emissions having two or more different major peak wavelengths, in which said light emissions are mixed together to show a color.

(14) A semiconductor light-emitting device fabrication process, characterized by comprising:

a first step of forming a first electrically conductive type semiconductor layer on a growth substrate, a second step that is carried out after the first step to form a recess in the first electrically conductive type semiconductor layer by etching, a third step that is carried out after the second step to form an active layer contiguously to two or more different plane orientations of the first electrically conductive type semiconductor layer, and a fourth step of forming a second electrically conductive type semiconductor layer.

(15) The semiconductor light-emitting device fabrication process according to (14), characterized in that said semiconductor layers and said active layer are each a gallium nitride semiconductor layer.

(16) The semiconductor light-emitting device fabrication process according to (15), characterized in that said growth substrate in the first step is a sapphire substrate whose major surface is defined by a C plane, and the first electrically conductive type semiconductor layer is grown on the C plane of said substrate.

(17) The semiconductor light-emitting device fabrication process according to (15), characterized in that said recess in the second step is formed by exposing an M plane or/and an A plane of the gallium nitride semiconductor layer.

(18) The semiconductor light-emitting device fabrication process according to (15), characterized in that said active layer has a quantum well structure including a well layer comprising an In-containing gallium nitride semiconductor layer.

BRIEF EXPLANATION OF THE DRAWINGS

FIGS. 2(a), 2(b) and 2(c) are illustrative in schematic of how to grow the active layer on the exposed planes of the recess.

FIG. 3 is illustrative of how to grow the active layer.

FIG. 11 is illustrative in schematic of what positions the sapphire substrate and the plane orientations of GaN are in.

DETAILED EXPLATION OF THE INVENTION 1.0 Outline of Nitride Semiconductor Device

Figure 10:
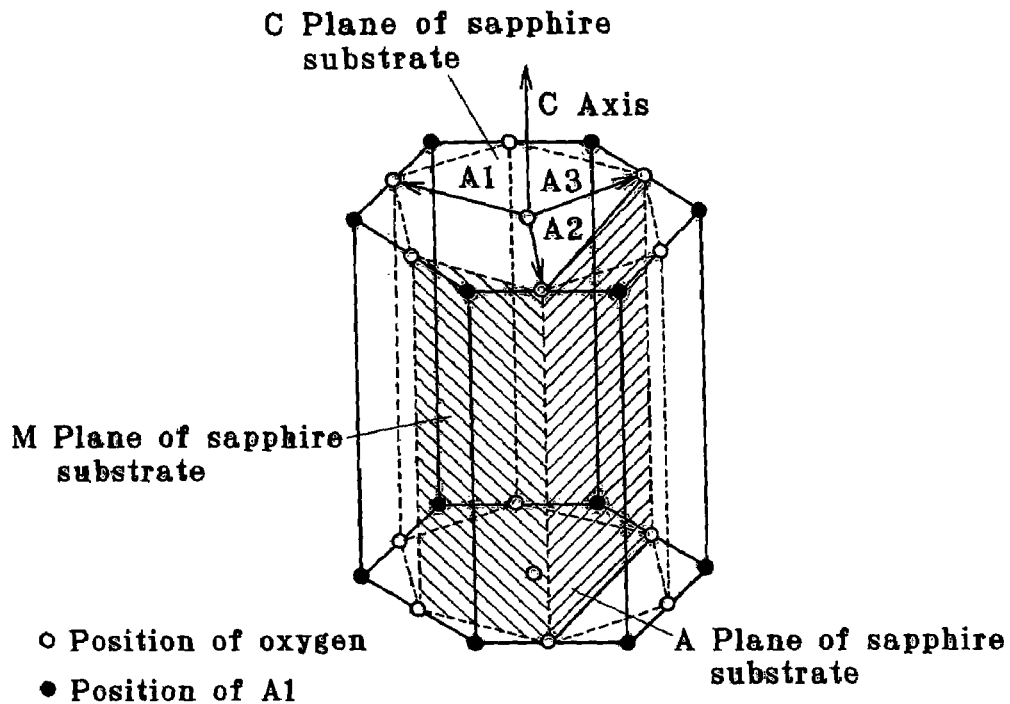
FIG. 10 is illustrative in schematic of the plane orientations of a sapphire substrate.

Embodiments of the invention are now explained in detail with reference to the drawings. The fundamental principles of the invention are first explained with reference to FIGS. 10 to 14. FIG. 10 is illustrative in schematic of the plane orientations of a sapphire substrate. As already described, a nitride semiconductor device comprising a gallium nitride (GaN) semiconductor layer generally comprises a sapphire substrate in which a first electrically conductive (n) type nitride gallium semiconductor layer, an active layer and a second electrically conductive (p) type gallium nitride semiconductor layer are stacked on the C plane thereof. Here, the plane orientations of the sapphire substrate ($Al_2O_3$) are expressed in terms of lattice points defined by oxygen atoms (O) indicated by white dots in FIG. 10.

Figure 11:
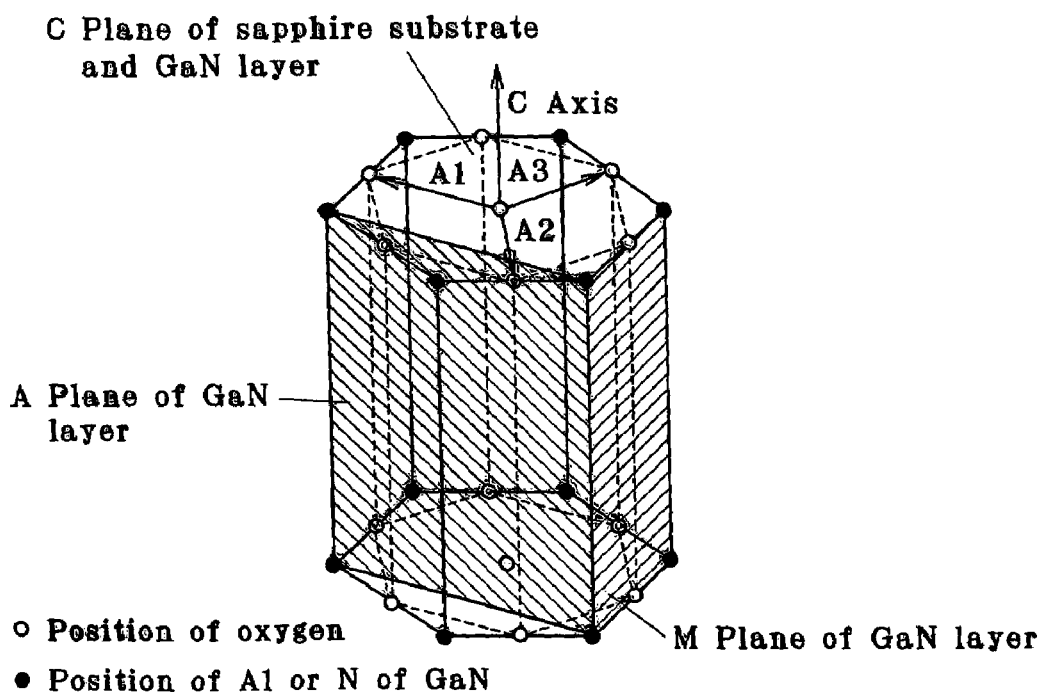

The GaN semiconductor layer grown on the sapphire substrate has such plane orientations as shown in FIG. 11. Referring to FIG. 11, the GaN semiconductor layer grows such that the A plane of the sapphire substrate is in alignment with the M plane of the GaN semiconductor layer and the A plane of the GaN semiconductor layer is in alignment with the M plane of the sapphire substrate. In either case, however, the C-axis directions of the sapphire substrate and the GaN semiconductor layer are in alignment. As will be described later, the present invention is characterized in that the n-type gallium nitride semiconductor layer is grown on the C plane of the sapphire substrate while its major surface is defined by its C plane, the n-type gallium nitride semiconductor layer is etched out to form a recess (concave portion) in which a plane orientation different from that of the major C plane is exposed, and the active layer is grown on the exposed surface having a plane orientation different from that of the C plane, the bottom surface of the concave portion and the upper surface of a portion of the n-type gallium nitride semiconductor layer other than the recess.

Figure 12:
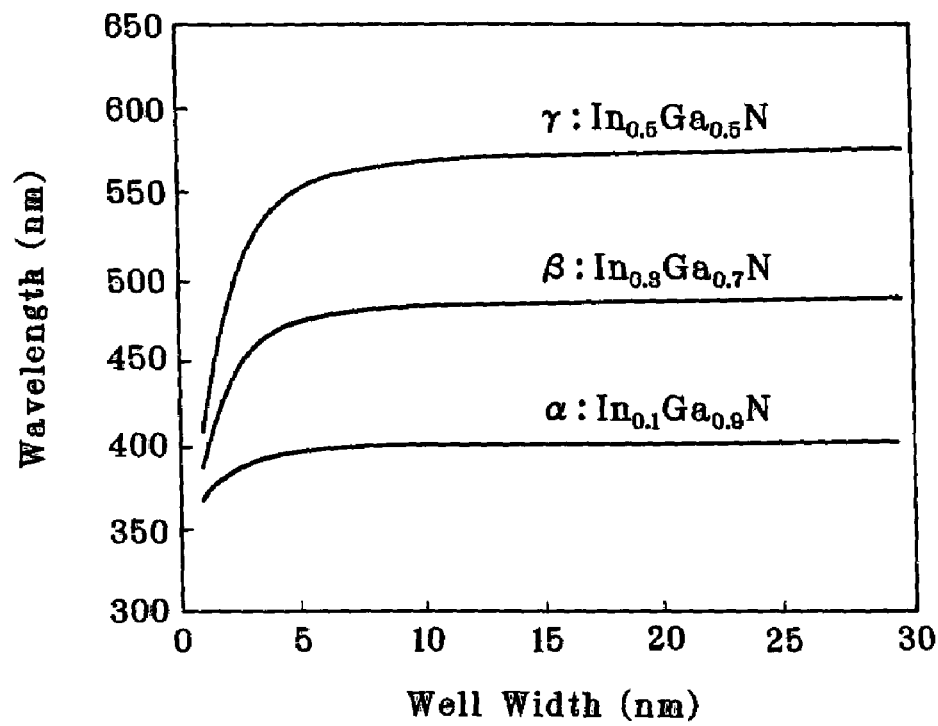
FIG. 12 is a well layer thickness vs. light emission peak wavelength diagram.
Figure 13:
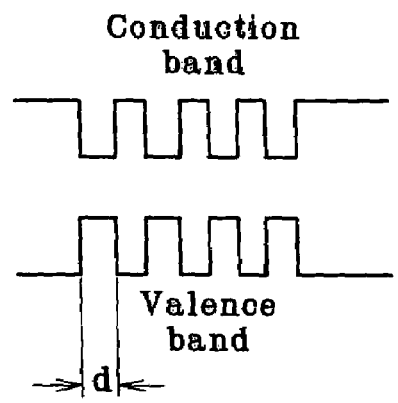
FIG. 13 is illustrative of the well layer thickness.

Next, a nitride semiconductor light-emitting device of the double-heterojunction has such an energy band as shown in FIG. 13, and forms a multiple quantum well as an example. Here, d is the width of the quantum well, and as d changes, there is a change in the light emission peak wavelength, as shown in FIG. 12 that is a wavelength vs. well width diagram. It is noted that FIG. 12 is a wavelength vs. well width diagram for a single quantum well structure. More specifically, FIG. 12 is a light emission peak wavelength vs. well width diagram at a Boeing parameter of 2.0 eV, a GaN band gap energy of 3.40 eV and an InN band gap energy of 1.89 eV. Referring here to FIG. 12, it is noted that many reports are available about the Boeing parameters of GaN and InN that have yet to be clarified, and so 2.0 eV is used as a typical one thereof. A curve α stands for an $In_{0.1}Ga_{0.9}N$ active layer, a curve β an $In_{0.3}Ga_{0.7}N$ active layer, and a curve γ an $In_{0.5}Ga_{0.5}N$ active layer. Curve α teaches that light emission of around 400 nm takes place at the fundamental band gap energy, but the light emission peak wavelength becomes short with a decrease in the well layer width. This tendency becomes more noticeable as the content of In becomes large. For instance, curve γ shows that a light emission peak wavelength of about 580 nm is obtained at the fundamental band gap energy, but as the well layer width becomes small, the wavelength becomes as short as about 400 nm.

Thus, the nitride semiconductor light-emitting device changes in the light emission peak wavelength depending on the thickness of the active layer, emitting different colors. The present invention makes use of the fact that the active layer to be formed on the gallium nitride semiconductor layer grows at different rates depending on plane orientations. In other words, when the plane orientation of the active layer different from that of the C plane of the n-type gallium nitride semiconductor layer is exposed and the active layer is grown on the exposed plane and the C plane, the active layer comes in contact with a plurality of planes, i.e., the C plane and a plane different from it.

Accordingly, there is a difference in the growth rate of the active layer depending on at what plane the active layer is in contact with the n-type gallium nitride semiconductor layer, with the result that there is a change in the width of the quantum well formed on the respective planes. Consequently, light emissions of different light emission wavelengths can be given out of the active layer on the gallium nitride semiconductor layer on the basis of such principles as shown in FIG. 12. Light having a plurality of colors can also be emitted. In a nitride semiconductor device in general, there is a difference in the growth rate of an active layer depending on at what plane the active layer is in contact with a nitride semiconductor layer, and the growth rate is determined by factors such as growth temperatures, pressures in reactors and III/V (gallium/nitrogen) ratios. The C, A and M planes of a gallium nitride semiconductor could be set such that the growth rate, for instance, becomes highest on the C plane as is the case with C>A>M. Conversely, the growth rate could become lowest on the C plane. When the growth rate is low, as a matter of course, the thickness of the active layer formed within the same time becomes smaller as compared with a higher growth rate.

Figure 14:
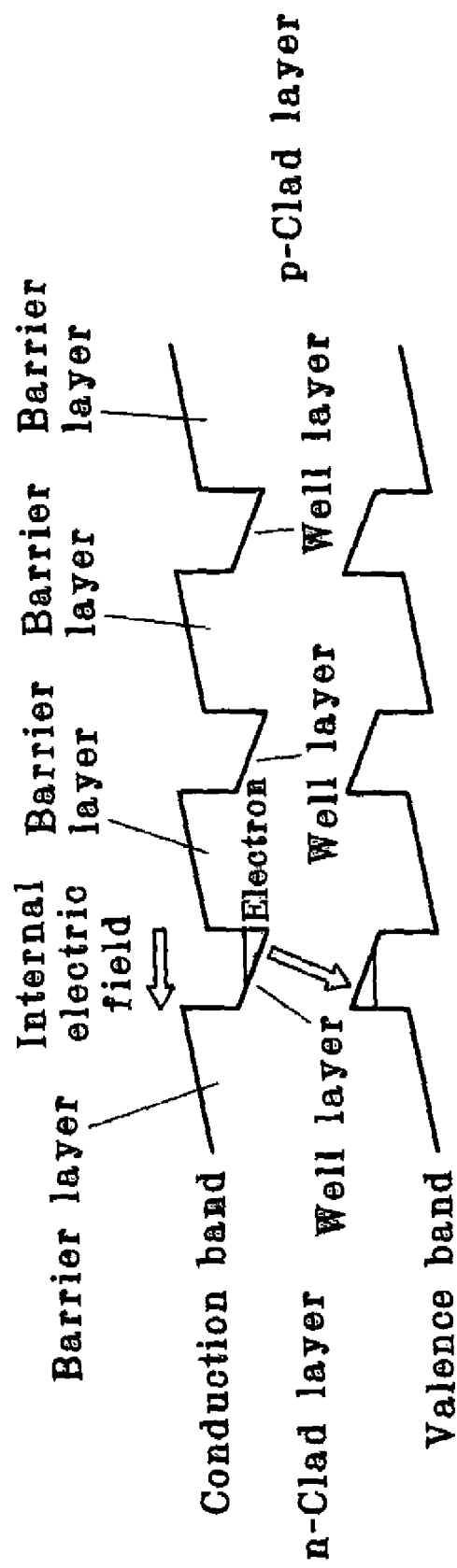
FIG. 14 is illustrative of the internal electric field of the nitride semiconductor device.

Referring here to a nitride semiconductor device comprising a nitride semiconductor layer formed on a sapphire substrate, especially on the C plane of sapphire, a piezoelectric field (internal electric field) occurs in a well layer in the active layer. FIG. 14 is illustrative of such an internal electric field. In general, a nitride semiconductor layer is formed of a material having a piezoelectric effect large enough to induce compression distortion, resulting in the occurrence of an internal electric field. In turn, this internal electric field causes a tilt of the band in the well layer so that electrons are spatially isolated from holes, changing the light emission wavelengths. Harnessing the fact that the magnitude of such an internal electric field differs with the plane orientations of the nitride semiconductor layer, the present invention is designed to grow the active layer in a plane orientation different from that of the aforesaid C plane, so that the magnitude of the internal electric field varies as explained with reference to FIG. 14, allowing the active layer to give out light emissions of different light emission wavelengths, i.e., different colors.

The active layer formed on the aforesaid C plane of sapphire is a polar plane, and so the piezoelectric field occurs; however, with the active layer formed on the A or M plane, there is no piezoelectric field. Consider here such conditions that the growth rate of the active layer becomes C>A>M. The active layer grows more slowly on the A or M plane than on the C plane, and so the width of the well layer becomes smaller with a shift of the light emission wavelength to shorter wavelengths (1). With the active layer grown on the C plane, there is a piezoelectric field with a shift of the light emission wavelength to longer wavelengths (2). In this way, the synergistic effect of (1) plus (2) is obtainable. For this reason, the growth rate of the active layer should preferably be set at C>A>M, because the greatest light emission peak difference is achievable. For instance, with the active layer grown at the growth rate of A>M>C, smaller light emission peak differences are achievable.

The present invention is characterized in that light emissions of different wavelengths can be emitted from within the same active layer by thickness control of the active layer. In some cases, however, difficulty may be encountered in giving out light emissions of different wavelengths only by thickness control of the active layer. According to the invention taking advantage of the piezoelectric field effect as explained with reference to FIG. 14, the proportion of In present in the In-containing active layer as explained with reference to FIG. 12, the proportion of impurities (that are incorporated in the well or barrier layer in the active layer), etc., it is possible to give out light emissions having various peak wavelengths.

Figure 1:
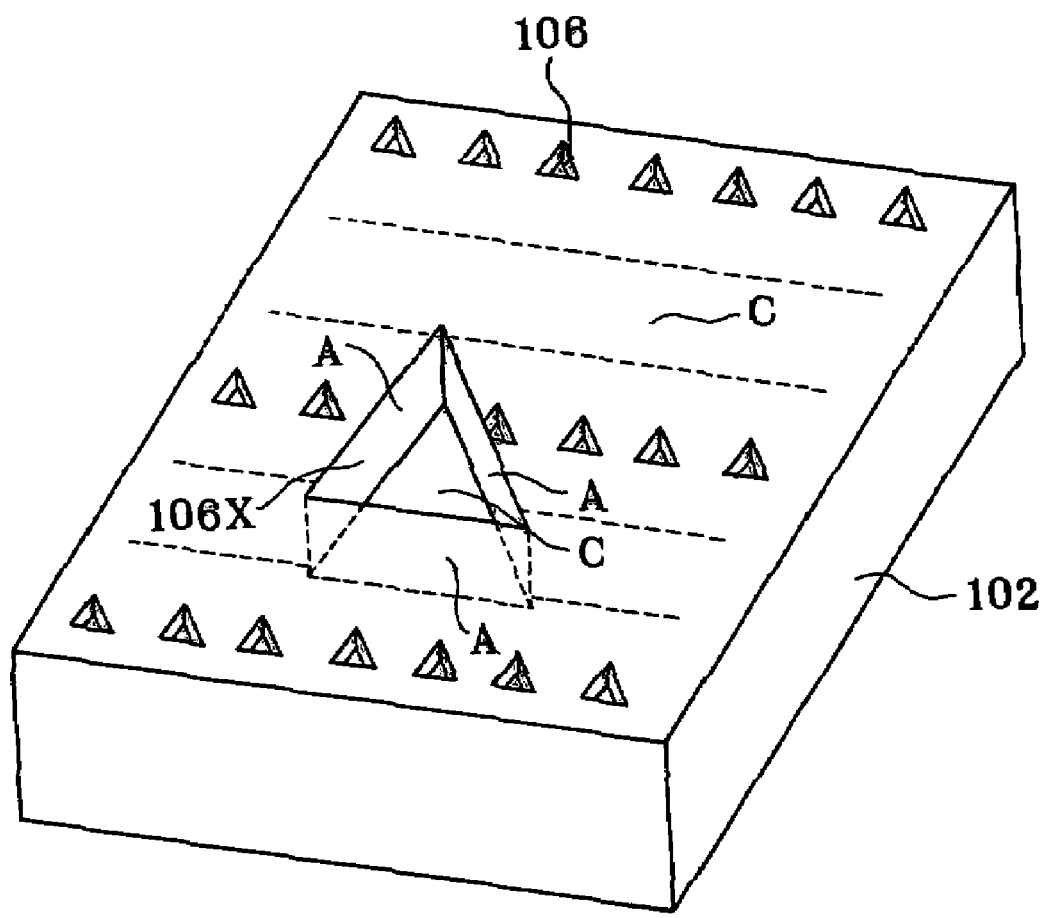
FIG. 1 is illustrative in perspective of one embodiment of the nitride semiconductor device according to the invention.

FIG. 1 is illustrative in perspective of one embodiment of the nitride semiconductor device according to the invention. A first electrically conductive n-type gallium nitride semiconductor layer (a first electrically conductive type semiconductor layer) 102 is formed on a growth (sapphire) substrate with its major surface defined by a C plane. Recesses 106 are formed in the C plane of the gallium nitride semiconductor layer 102 by means of etching. Reference numeral 106x is an enlarged view of one recess element. In the invention, each or the recess is formed by etching to expose a plane orientation different from that of the major C plane. In the embodiment of FIG. 1, the recess 106 is in a regular triangle form wherein the A plane orientations are exposed on side faces.

According to the invention, an active layer is formed on the planes of the recess formed by etching, the bottom of the recess and the upper surface of the first electrically conductive type semiconductor layer 102 outside of the recess. Thus, the active layer comes in contact with two different planes, i.e., the C plane and the A plane exposed on the recess. FIGS. 2(a), 2(b) and 2(c) are illustrative in schematic of how to grow the active layer on the exposed planes of the recess. FIG. 2(a) is illustrative of how to grow an active layer 103 on the exposed A planes of the recess formed by etching. Reference numeral 102a stands for the C plane of the upper surface of the semiconductor layer 102, and 102b the C plane of the bottom of the recess. The active layer formed on the exposed planes grows in a direction orthogonal to the major C plane. In this embodiment, the angle between the plane orientations, for instance, is 60 degrees.

As shown in FIG. 2(b), the active layer 103 is grown on the exposed M planes of the recess formed by etching. In this embodiment, the angle between the exposed plane orientations, for instance, is 120 degrees. As shown in FIG. 2(c), the active layer 103 is grown on the exposed A and M planes of the recess formed by etching. In this embodiment, the angle between the exposed plane orientations, for instance, is 90 degrees.

FIG. 3 is a plan view of the gallium nitride semiconductor layer 102 upon etching. In this embodiment, the recess is formed by means of etching to expose an M plane orientation in a striped fashion. As in FIG. 2, the active layer 103 is grown on the exposed M plane orientation in a direction orthogonal to the major C plane. As shown in FIGS. 2 and 3, the active layer 103 comes in contact with at least two layers differing in plane orientation. This causes a change in the quantum well width and makes a difference in the internal electric field, as already described, so that light emissions of different light emission wavelengths, i.e., different colors can be emitted from within the active layer.

Figure 4:
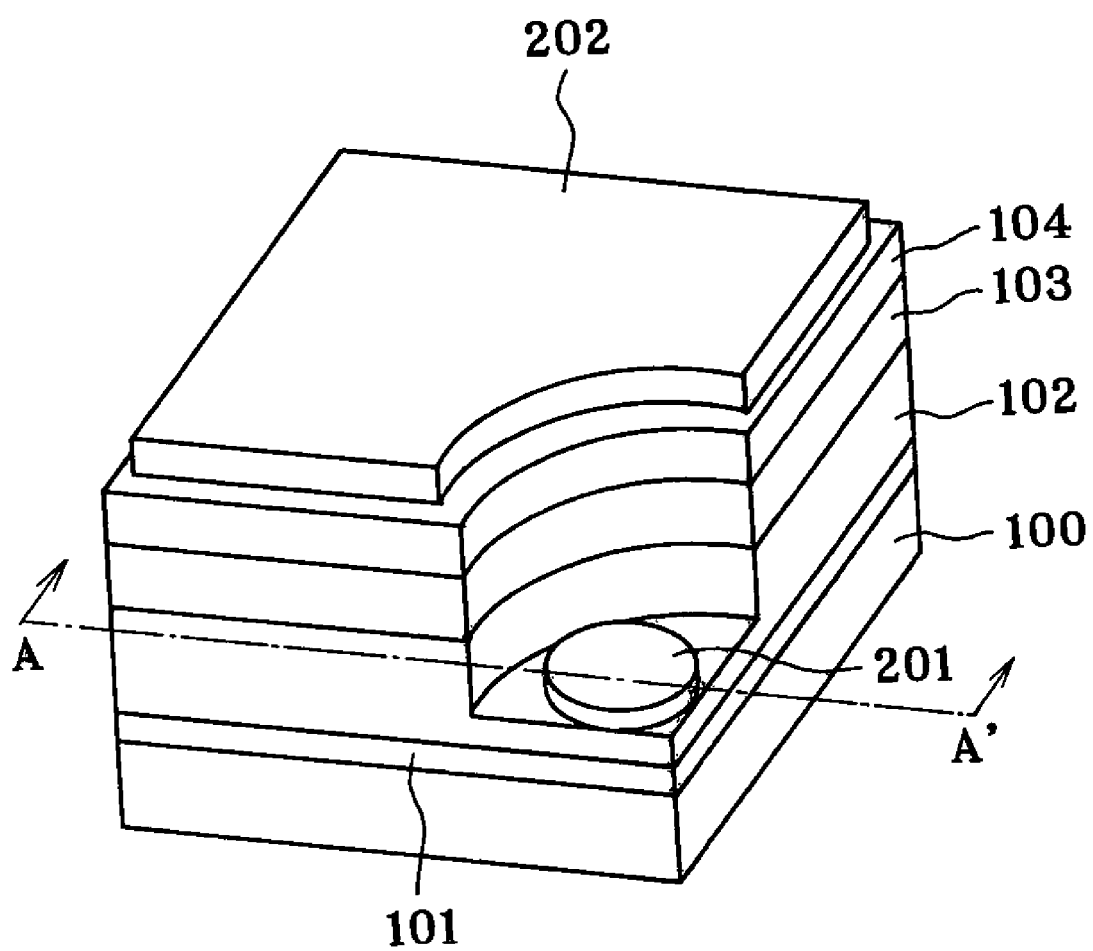
FIG. 4 is illustrative in schematic of one embodiment of the nitride semiconductor device according to the invention.
Figure 5:
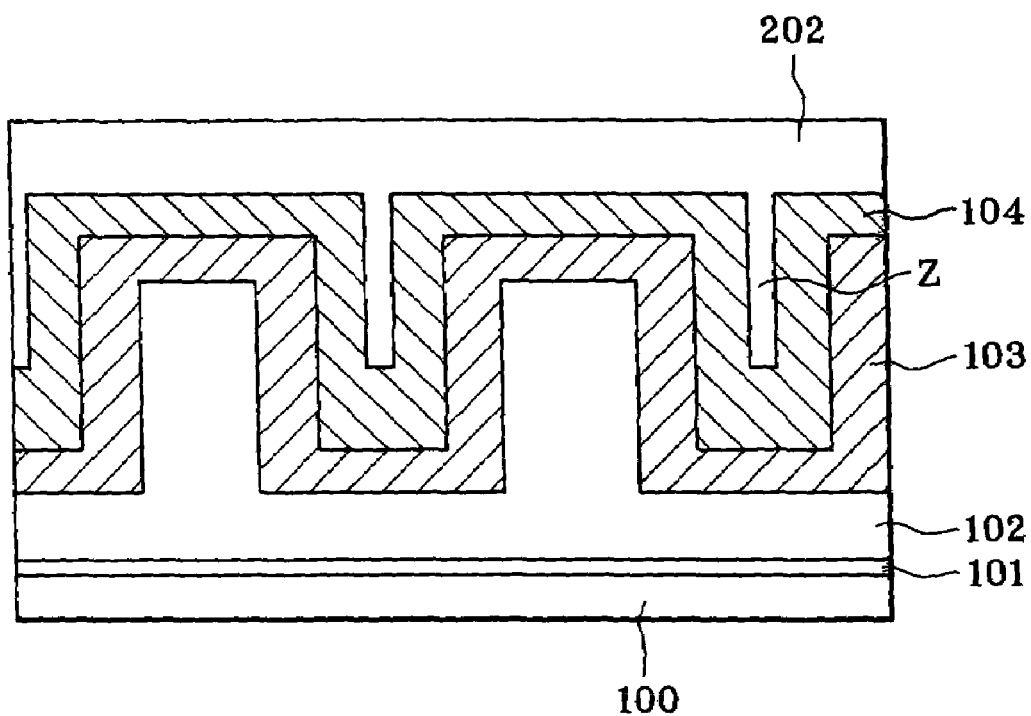
FIG. 5 is one sectional schematic of the nitride semiconductor device as taken on its vertical section.
Figure 6:
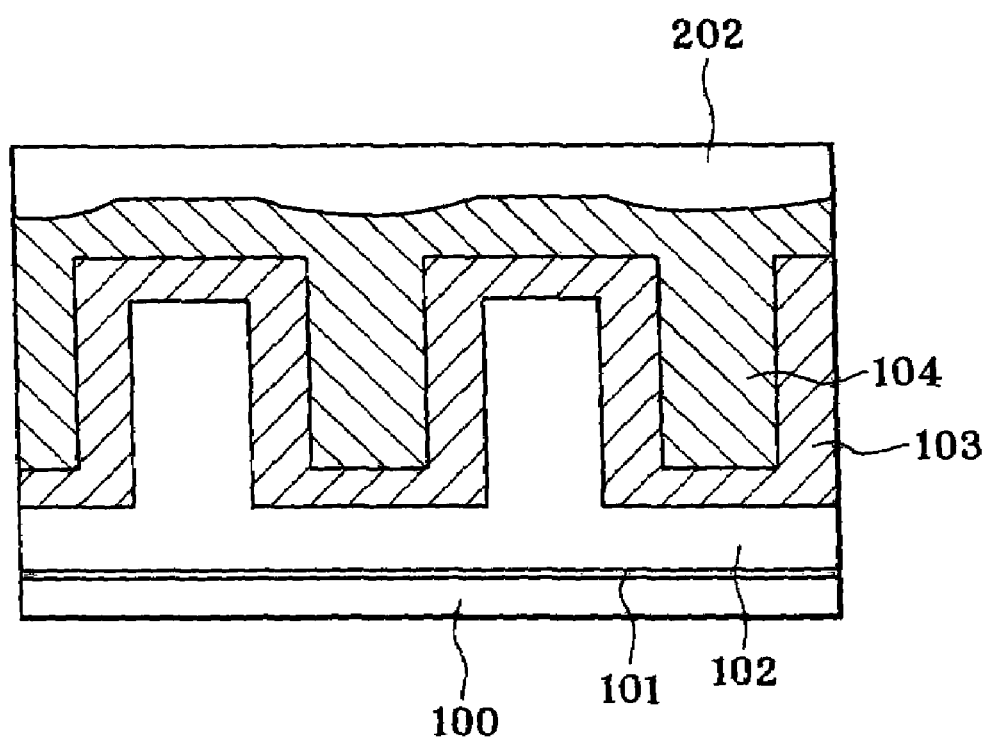
FIG. 6 is another sectional schematic of the nitride semiconductor device as taken on its vertical section.

FIG. 4 is illustrative in schematic of one embodiment of the nitride semiconductor device according to the invention, and FIGS. 5 and 6 are two different sectional schematics of the nitride semiconductor device of FIG. 4 taken on its vertical plane. As shown in FIG. 4, a first electrically conductive n-type gallium nitride semiconductor layer 102 is formed on a growth substrate 100 with a buffer layer 101 comprising a gallium nitride semiconductor layer interposed between them. Reference numeral 103 stands for an active layer, 104 a second electrically conductive p-type gallium nitride semiconductor layer (a second electrically conductive type semiconductor layer), 201 an n-electrode, and 202 a p-electrode.

Referring to FIG. 5, the active layer 103 is grown on a plane orientation that is exposed upon formation of a recess by etching of the first electrically conductive n-type gallium nitride semiconductor layer 102, the bottom of the recess and the upper C plane of the semiconductor layer 102 outside of the recess. In other words, the active layer 103 is formed within and without the recess In a space surrounded by the active layer 103 grown in the recess formed by etching, there is formed the second electrically conductive p-type semiconductor layer 104. The gallium nitride semiconductor layer 104 is provided with a groove Z conforming to the configuration of the recess formed by etching. In the embodiment of FIG. 6, it is noted that the whole surface of the recess is covered with the second electrically conductive p-type gallium nitride semiconductor layer 104 with no formation of such a groove as depicted in FIG. 5.

In the nitride semiconductor layer of the invention, the active layer 103 thus comes in contact with the first electrically conductive n-type gallium nitride semiconductor layer 102 and the second electrically conductive p-type gallium nitride semiconductor layer 104. More specifically, the active layer includes a plurality of end faces different from the two major surfaces with a heterojunction between them, wherein the end faces are opposite to the upper surface of the device. Thus, the gallium nitride semiconductor device is designed in such a way as to make effective use of light emissions frp, the end faces of the active layer.

Further, the exposed plane orientation of the first electrically conductive n-type gallium nitride semiconductor layer 102 is defined by the M or A plane of the gallium nitride semiconductor layer, and the side face of the second electrically conductive p-type gallium nitride semiconductor layer 104 is defined by the M or A plane of the gallium nitride semiconductor layer. When gallium nitride is grown on a heterogeneous substrate such as a sapphire substrate, it is impossible to grow thereon a gallium nitride semiconductor layer whose major surface is defined by the M or A plane. If somehow grown, that gallium nitride semiconductor layer is of extremely low crystallinity. This is the reason gallium nitride is grown on the sapphire substrate whose major surface is defined by the C plane. The gallium nitride formed on the C plane of the sapphire substrate grows in the C-axis direction, with the C plane defining the major surface.

Such a gallium nitride semiconductor layer whose major surface is defined by the C plane is of much better crystallinity. After formation of the gallium nitride semiconductor layer whose major surface is defined by the aforesaid C plane, the recess is formed by etching in the gallium nitride semiconductor layer in such a way that the vertical plane (preferably the M or A plane) of the gallium nitride semiconductor layer is exposed. Then, the active layer is grown on the plane of the exposed plane orientation, the bottom of the recess and the upper surface of the C plane outside of the recess. At this time, the junction surface formed between the gallium nitride semiconductor layer and the active layer is defined by the C and M planes, the C and A plane or the A, C and M planes.

A p-type gallium nitride semiconductor layer is further formed after growth of the active layer on the plane of the exposed plane orientation. When the junction surface between the active layer and the n-type layer is the M plane, the junction surface between the p-type gallium nitride semiconductor layer and the active layer, too, is defined by the M plane of the gallium nitride semiconductor layer. When the junction surface between the active layer and the n-type layer is the A plane, on the other hand, the junction surface between the p-type gallium nitride semiconductor layer and the active layer, too, is defined by the A plane of the gallium nitride semiconductor layer. In other words, the junction surface between the p-type gallium nitride semiconductor layer and the active layer is defined by the M or A plane of the gallium nitride semiconductor layer. It follows that either the interface between the active layer and the n-type layer or the interface between the active layer and the p-type layer is defined by the M or A plane.

The present invention is characterized in that the first electrically conductive type semiconductor layer (the first electrically conductive n-type gallium nitride semiconductor layer 102) as explained with reference to FIGS. 5 and 6 comes in contact with the active layer in two or more different plane orientations. Specific embodiments wherein the active layer comes in contact with the first electrically conductive type semiconductor layer in two or more different plane orientations are now explained.

(1) When the recess formed by etching in the first electrically conductive n-type gallium nitride semiconductor layer is not vertical, for instance, the R plane is so exposed that the active layer comes in contact with the semiconductor layer in C and R plane orientations. Thus, the recess formed in the first conduction type gallium nitride semiconductor layer according to the invention is not necessarily limited to a vertical recess. When the recess formed by etching in the first electrically conductive n-type gallium nitride semiconductor layer is vertical, the following embodiments (2) to (5) could be envisaged.

(2) The active layer comes in contact with the semiconductor layer in the C and M plane orientations. When the A or M plane is exposed by forming a recess in the first electrically conductive type semiconductor layer, a layer of better crystallinity is obtainable on the M plane than on the A plane due to characteristic differences. Accordingly, if the plane orientation in which the active layer comes in contact with the semiconductor layer is defined by a combination of the C plane with the M plane, it is then possible to grow an active layer improved in crystallinity, thereby obtaining a semiconductor light-emitting device having high light emission efficiency.

Besides, there are possible embodiments (3) wherein the active layer comes in contact with the semiconductor layer in the C and A plane orientations, (4) wherein the active layer comes in contact with the semiconductor layer in the A and M plane orientations, and (5) the active layer comes in contact with the semiconductor layer in the three plane orientations, i.e., the C, A and M plane orientations. According to (5), a relatively broad light emission is achievable. According to these embodiments, various thickness differences can be made with the growth rate varying with growth conditions in mind, so that two or more light emission peak wavelengths can be obtained in discrete relations or the resultant spectral width can be varied. It is thus possible to make a selection from the embodiments while crystallinity and growth rate are taken into account, thereby obtaining semiconductor light-emitting devices having a variety of properties.

In the present invention, the area ratio of the active layer on the C plane to the active layer on the A or M plane could be proportional to the intensity ratio of light having each major peak wavelength. Referring to FIG. 1, even when the first electrically conductive type semiconductor layer is etched, the area of the active layer on the C plane is the same as that before etching or invariable as viewed from above. From this fact, it is found that the luminous intensity ratio of light can be controlled by increasing or decreasing the area of the active layer on the A or M plane. The active layer emits light in a surface-emitting form; the number of recesses formed by etching, the depth of etching (the surface area of the active layer), etc. are appropriately set so that the intensity ratio of light emissions having different wavelengths can be controlled.

The present invention has such additional advantages as mentioned below. In a conventional gallium nitride semiconductor device, an active layer-containing gallium nitride semiconductor layer is formed on a heterogeneous substrate such as a sapphire substrate in the direction vertical to the substrate. For instance, the gallium semiconductor is formed on the C plane of the sapphire substrate in the C-axis direction only of the gallium nitride semiconductor layer. A problem with that gallium nitride semiconductor device is that by reason of a difference in the coefficient of thermal expansion between the heterogeneous substrate and the gallium nitride semiconductor, compression distortion or tensile distortion is applied on the junction surface between the respective layers. In particular, the distortion has a large influence on the active layer; the distortion makes the band gap of the active layer complicated or induces a number of crystal defects in the active layer, rendering light emission efficiency much worse.

According to the invention, however, any large distortion is not applied on the active layer because some portion of the active layer 103 is vertical to the growth substrate 100. In turn, this makes it possible to obtain a nitride semiconductor device with distortion ascribable to the coefficient of thermal expansion much more reduced than ever before. Consequently, a film of improved crystallinity is so obtained that the area of the device can easily be increased. In the present invention, it is here noted that while the internal electric field traceable to compression distortion is not perfectly eliminated, light emissions of different light emission wavelengths or a plurality of colors can be obtained by taking full advantage of the internal electric field that differs depending on plane orientation, as already described.

In the present invention, the exposed plane of the n-type gallium nitride semiconductor layer, i.e., the junction interface between the active layer and the n-type layer should preferably be the M or A plane. However, if the OF angle is in the range of smaller than 7° to 8° with respect to the M (or A) plane, the junction interface is dominantly governed by the M plane, resulting in a reduction of the piezoelectric field. In other words, the effect on the reduction of the piezoelectric field is still useful, although it is slightly inferior to that achieved when the junction interface is defined by an intrinsic M or A plane. If the M or A plane accounts for 80% or more of the side face of the n-type layer or the side face of the recess, it has then a similar, if not equivalent, effect on the reduction of the piezoelectric field, because that plane behaves as a dominant junction interface. The same holds true for the junction interface between the p-type gallium nitride semiconductor layer and the active layer.

Whether the junction surface between the active layer and the n-type gallium nitride semiconductor layer, and the junction surface between the p-type gallium nitride semiconductor layer and the active layer is the M plane or the A plane could make such differences as described below. When the above junction surface is the M plane, the M plane provides a very stable plane in the gallium nitride semiconductor layer. This is preferable in that crystal growth is easily controllable so that a plane having high flatness and, hence, an active layer of high crystallinity can be obtained. When the above junction surface is the A plane, an active layer can be obtained within a shorter time in the gallium nitride semiconductor layer because a faster growth rate is achievable on the A plane than on the M plane. This is preferable in view of productivity.

Most preferably for the object of the invention, the junction surface between the active layer and the n-type gallium nitride semiconductor layer, and the junction surface between the p-type gallium nitride semiconductor layer and the active layer should be the M plane where an active layer of high crystallinity is obtainable. In this case, the active layer comprises a plurality of continuous M planes that make an angle of 60°, 120°, 240° or 300°, as viewed from the upper surface of the n-type gallium nitride semiconductor layer. Alternatively, the active layer could have an M plane formed in a striped fashion, as viewed from the upper surface of the n-type gallium nitride semiconductor layer having a pit-and-projection pattern.

2.0 Specific Construction of Nitride Semiconductor Device

A. Growth Substrate 100

Sapphire is preferred for the growth substrate 100 that provides a base for gallium nitride growth. Especially with sapphire whose major plane is a C plane, it is possible to form a gallium nitride semiconductor layer of high crystallinity. Further, as the gallium nitride is grown on the C plane of the sapphire substrate, the M or A plane of gallium nitride, which is exposed by formation of a recess by etching, provides a plane vertical to sapphire. It is thus possible to expose the M plane with relative ease in fabrication processes.

When only or at least the M plane of gallium nitride is exposed in fabrication processes, it is preferable to use sapphire in which the major surface is defined by a C plane and the orientation flat surface is defined by an A plane. This is because given the A plane of the orientation flat surface, the M plane of gallium nitride is defined by a plane parallel with the orientation flat surface and vertical to the C plane, so that the M plane of gallium nitride can be exposed with ease. The same holds true for when only or at least the A plane of gallium nitride is exposed; the A plane of gallium nitride can be exposed with ease by making use of sapphire whose major surface is defined by a C plane and whose orientation flat surface is defined by an M plane, so that the A plane of gallium nitride can again be exposed with ease. When sapphire is used for the growth substrate 100, the major surface could be defined by an OF-angled C plane.

As explained above, the sapphire substrate whose major surface is defined by the C plane of sapphire is preferable for the growth substrate 100 used herein. However, the present invention is not always limited to the sapphire substrate; other growth substrates could be used provided that, in the gallium nitride semiconductor layer, they provide a C-plane junction surface for the growth substrate. For instance, a possible candidate for other growth substrate 100 could be silicon carbide, although its properties are inferior to those of the sapphire substrate.

When the growth substrate 100 used herein has insulating properties, a part or the whole of the gallium semiconductor layer is formed. Thereafter, the growth substrate is stripped away by laser irradiation or the like, and then removed by polishing or the like, so that a gallium nitride substrate can be used as the substrate.

This gallium nitride substrate is characterized in that the major surface is defined by the C plane. When gallium nitride is used as the substrate, at least 80-µm thick single undoped or Si doped gallium nitride is necessary. By removal of the growth substrate to form the gallium nitride substrate, one electrode is formed on the gallium nitride substrate. It is thus possible to obtain a gallium nitride semiconductor device with an n-electrode opposite to a p-electrode, so that uniform currents can readily flow through the device, and the size of the device can be reduced as well.

B. First Electrically Conductive n-Type Gallium Nitride Semiconductor Layer 102 Having Recesses For the n-type gallium nitride semiconductor layer 102, a single layer or a plurality of layers, comprising $Al_xIn_yGa_{1-x-y}N$ where $0 \leq x$, $0 \leq y$ and $x+y<1$, are formed. For this n-type gallium nitride semiconductor layer 102, one requirement is that the plane orientation exposed by etching be the M or A plane of the gallium nitride semiconductor layer. More preferably, the upper surface of the semiconductor layer 102 should be the C plane of the gallium nitride semiconductor.

In the present invention, the n-type gallium nitride semiconductor layer comprises a clad layer for feeding carriers in at least an active layer and confining the carriers within the active layer. For this clad layer, an appropriate selection is made from materials that have a band gap larger than that of the active layer and ensure a sufficient offset with respect to the active layer. When an active layer comprising InGaN is formed, the n-type gallium nitride semiconductor layer, if GaN or AlGaN is used for it, functions preferably as the clad layer.

Additionally, the n-type gallium nitride semiconductor layer 102 may comprise an n-type contact layer in good ohmic contact with an n-electrode. The n-type contact layer is a layer in contact with the electrode, and so should preferably be of low resistance. For the gallium nitride semiconductor, Si doped GaN is preferred as the n-type impurity.

The n-type gallium nitride semiconductor layer 102 having recesses formed by etching is obtained by stacking the gallium nitride semiconductor layer on the substrate in the C-axis direction, and thereafter carrying out etching in such a way as to expose the M or A plane of the gallium nitride semiconductor layer. Alternatively, the n-type gallium nitride semiconductor layer having recesses could be used as the first n-type layer. In this case, after formation of the recesses, another n-type gallium nitride semiconductor layer could further be formed on the exposed M or A plane of the semiconductor layer as the second n-type layer. The second n-type gallium nitride semiconductor layer could function as a clad layer in the case of a light-emitting diode (LED), and as a light guide layer in the case of a semiconductor laser diode (LD).

A crystallinity recovery layer or the like could also be formed in the recess. If such a layer is formed on the surface roughened by dry etching such as RIE (reactive ion etching), the active layer of high crystallinity can then be formed. For drying etching of the above n-type gallium nitride semiconductor layer, use could also be made of CAIBE (chemically assisted ion beam).

The shape of the above recess will be explained with reference to FIGS. 7-9; however, it is noted that the present invention is not necessarily limited to a recess defined by straight lines or configured to a linear recess. For instance, etching could be carried out in such a way as to form a columnar recess in the gallium nitride semiconductor layer by cutting. When the gallium nitride semiconductor layer is etched to form a columnar recess and the active layer is grown on its side faces, the A or M plane is preferentially grown due to the inherent nature of the gallium nitride semiconductor. The preferentially grown plane is determined by appropriate selection of growth systems for epitaxial growth of gallium nitride, and growth conditions such as growth temperatures, III/V ratios and growth pressures.

The present invention is characterized in that the plane orientations vertical to the C plane are exposed on the exposed surfaces of the recess in the gallium nitride semiconductor layer. Referring to the vertical plane orientations, it is understood that planes of the nitride gallium semiconductor layer other than the A and M planes have large surface energy and so are instable; it is substantially difficult to form the active layer on those planes. Accordingly, although no particular limitation is imposed on the exposed surfaces of the recess formed by etching except that they are vertical to the C plane, it is noted that the gallium nitride semiconductor is susceptible to growth on the A or M plane vertical to the C plane.

When the nitride semiconductor device is used as a light-emitting diode, the nitride semiconductor layer is allowed to function as a clad layer, if required. An advantage of forming the nitride semiconductor device in a striped fashion is that a laser device is obtained. When the nitride semiconductor device is used as a laser diode, the nitride semiconductor layer is allowed to function as a light guide layer. A plurality of layers could be used as a clad layer and a light guide layer, respectively. For the light guide layer, an appropriate selection should be made from materials ensuring that light is fully confined within the active layer.

Figure 7:
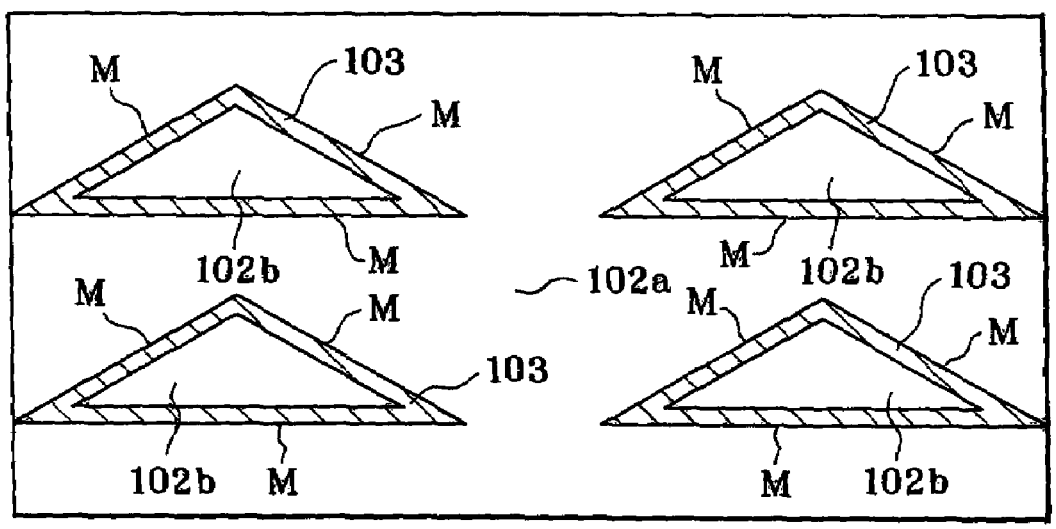
FIG. 7 is one sectional schematic of another embodiment of the nitride semiconductor device as taken on a horizontal plane.
Figure 8:
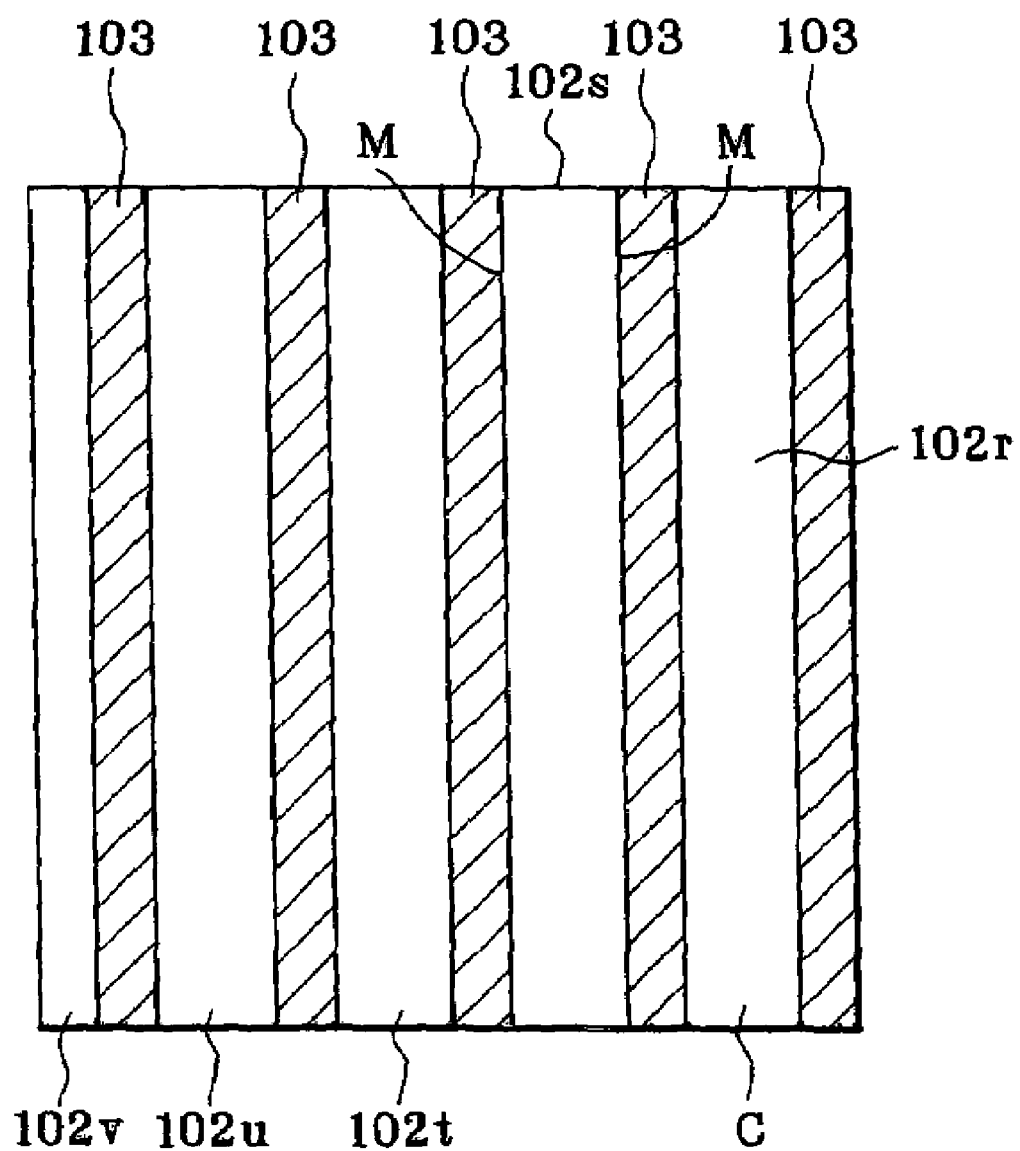
FIG. 8 is one sectional schematic of yet another embodiment of the nitride semiconductor device as taken on a horizontal plane.
Figure 9:
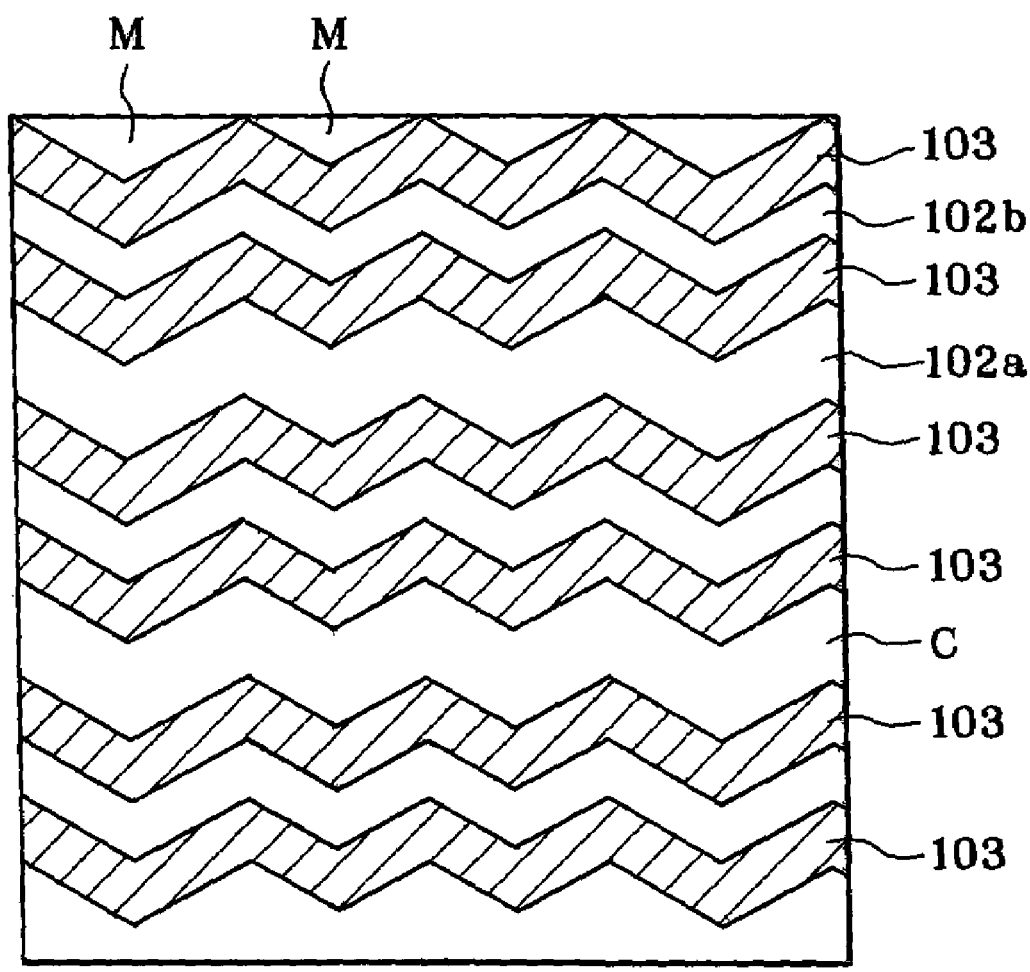
FIG. 9 is one sectional schematic of a further embodiment of the nitride semiconductor device as taken on a horizontal plane.

In the present invention, the recess should be configured to such shapes as shown in FIGS. 7-9 as viewed from the upper surface of device in such a way that the junction surface between the recess and the active layer formed on the exposed plane orientation is defined by the M or A plane. FIGS. 7, 8 and 9 are illustrative of the junction surfaces between the n-type gallium semiconductor layer 102 and the active layer 103, i.e., the stepped portion of the recesses, and the junction surfaces between the active layer 103 and the second conduction n-type gallium nitride semiconductor layer 104. It is noted that the p-type gallium nitride semiconductor layer 104 is not shown.

Referring to the shape of the junction surface, a triangular shape is shown in plan in FIG. 7, a striped shape in FIG. 8, and a repetitively corrugated shape with back-to-back side face angles of 120° and 240° is shown in FIG. 9. As shown in FIG. 7, there are a plurality of active layers 103, each with a triangular junction surface, in the semiconductor light-emitting device. In FIG. 7, 102a is the C-plane upper surface and 102b the C-plane bottom of the recess. Referring to FIG. 8, a striped active layer 103 having a plurality of M planes is provided. Either junction surface corresponds to the M plane of the gallium nitride semiconductor. Reference numerals 102r to 102v are all the C planes. Referring to FIG. 9, an active layer 103 having a plurality of continuous M planes with a back-to-back plane angle of 120° or 240° is provided, and there are a plurality of such active layers 103 in the semiconductor light-emitting device.

The present invention is not necessarily limited to the shapes of the active layer shown in FIGS. 7, 8 and 9; other forms of active layers could be used herein. Although not shown, use could be made of an active layer in which all exposed plane orientations are defined by A planes, a repetitively corrugated active layer with back-to-back side face angles of 120° and 240°, and a regular triangular active layer with a back-to-back side face of 60°. Use could also be made of an active layer in which all exposed plane orientations are defined by the M or A planes, and a repetitively corrugated active layer with a back-to-back side face angle of any one of 30°, 60°, 90°, 120°, 150°, 210°, 240°, 270°, 300° or 330°.

That is, the present invention is not limited to the shapes shown in FIGS. 7, 8 and 9 provided that all the exposed plane orientations are defined by the M or A planes. The present invention could be applied to active layers with a back-to-back side face angle of 120°, because all the exposed plane orientations are defined by the M or A planes.

C. Active Layer 103

The active layer used herein comprises a single layer or a plurality of layers comprising $Al_xIn_yGa_{1-x-y}N$ where $0 \leq x$, $0 \leq y$ and $x+y<1$. A part of Ga could be substituted by B, and a part of N could be substituted by P, As or the like. The active layer could be of either a single heterojunction or a double heterojunction, and the quantum well could be of either a single quantum well structure or a multiple quantum well structure. To obtain LEDs or LDs having such properties as high efficiency, high luminance and high output, it is preferable to use a multiple quantum well structure wherein well layers and barrier layers are repetitively stacked together.

D. p-Type Gallium Nitride Semiconductor Layer 104

For the p-type gallium nitride semiconductor layer 104, a single layer or a plurality of layers comprising $Al_xIn_yGa_{1-x-y}N$ where $0 \leq x$, $0 \leq y$ and $x+y<1$ and doped with Mg as the p-type impurity are provided. In this p-type layer, a portion configured by the n-type layer and active layer is fully embedded. In other words, the uppermost surface of the p-type layer is at least flush with the uppermost surfaces of the n-type layer and active layer or higher than those uppermost surfaces. Preferably, the uppermost surface of the p-type layer should be flush with the uppermost surfaces of the n-type layer and active layer. In the present invention, the p-type gallium nitride semiconductor layer 104 could be composed of a first p-type layer filled in the recesses and a second p-type layer formed all over the uppermost surface of the device. For the second p-type layer, a p-type contact layer in good ohmic contact with at least the p-electrode 202 could be formed. This second p-type layer could be composed of a single layer or a plurality of layers comprising $Al_xIn_yGa_{1-x-y}N$ where $0 \leq x$, $0 \leq y$ and $x+y<1$ and doped with Mg as the p-type impurity, and formed all over the uppermost surface of the gallium nitride semiconductor device, thereby helping form the p-electrode. Thus, the semiconductor device has the same appearance as that of a conventional gallium nitride semiconductor device, so that the conventional device can easily be modified or altered.

It is then preferable to reduce the thickness of the second p-type layer because the absorption of light emitted out of the end faces of the active layer by the gallium nitride semiconductor device is minimized. Thus, a device having high light extraction efficiency can be achieved. It is also preferable to increase the thickness of the second p-type layer, for instance, because the surface of the gallium nitride semiconductor device is so fattened that its contact with the p-electrode can be improved. By allowing the second p-type layer to be grown on the C plane of the first p-type layer, it is possible to grow gallium nitride of high crystallinity and, hence, obtain satisfactory ohmic properties with respect to the p-electrode. When the second p-type layer is not formed, the p-electrode could be formed all over the upper surface of the gallium nitride semiconductor device after formation of the first p-type layer.

E. Other Layers

Besides, the n-type gallium nitride semiconductor layer, and the p-type gallium nitride semiconductor layer could be composed of a plurality of layers. Between the adjacent layers of the n-type gallium nitride semiconductor layer, active layer, p-type gallium nitride semiconductor layer and p-type contact layer, there could be interposed a layer having another function, for instance, a crystallinity recovery layer for repairing surface roughness of side faces which is induced upon etching of the first conduction n-type gallium nitride semiconductor layer 102, and degradation of crystals due to damage upon processing. When the nitride semiconductor of the invention is applied to a light-emitting diode (LED), a carrier-confining layer, a light-confining layer, a crystallinity-protecting layer for protecting the underlying crystal layer, etc. could be included in the aforesaid layer having another function.

In the present invention, the n-type gallium nitride semiconductor layer is provided with an n-electrode while the p-type gallium nitride semiconductor layer is provided with a p-electrode. With regard to material and thickness, these electrodes are selected in such a way as to obtain good ohmic contact with the gallium nitride semiconductor layer with which they are in contact. In particular, the p-electrode could be configured to any desired shape as long as good ohmic contact with the gallium nitride semiconductor layer with which it is in contact is achievable.

The nitride semiconductor device of the invention could have a variety of applications. For instance, the gallium nitride semiconductor device could be coated on its surface with a coating layer containing a fluorescent substance that absorbs a part or all of light coming from $Al_xIn_yGa_{1-x-y}N$ ($0 \leq x$, $0 \leq y$ and $x+y<1$) forming the active layer and gives out light emissions having different wavelengths. This enables light emissions of various wavelengths to be given out. In particular, the nitride semiconductor device with YAG incorporated in it can emit white light, and so can be used for illumination light sources or the like. The gallium nitride semiconductor device of the invention with limited distortion applied on the active layer is very useful for illumination light sources required to emit light over a large area.

3.0 Nitride Semiconductor Device Fabrication Process

How to fabricate the gallium nitride semiconductor device of the invention is now explained specifically with reference to the schematic representation of FIG. 5. The fabrication process of the invention is embodied as described in (1) to (9) below.

(1) The semiconductor light-emitting device fabrication process of the invention is characterized by comprising:

a first step of forming a first electrically conductive type semiconductor layer on a growth substrate, a second step that is carried out after the first step to form a recess in the first electrically conductive type semiconductor layer by etching, a third step that is carried out after the second step to form an active layer contiguously to two or more different plane orientations of the first electrically conductive type semiconductor layer, and a fourth step of forming a second electrically conductive type semiconductor layer.

(2) The semiconductor light-emitting device fabrication process as recited in (1) is further characterized in that said semiconductor layers and said active layer are each a gallium nitride semiconductor layer.

(3) The semiconductor light-emitting device fabrication process as recited in (1) or (2) is further characterized in that the growth substrate in said first step is a sapphire substrate whose major plane is defined by a C plane, wherein the first electrically conductive type semiconductor layer is grown on the C plane of said substrate.

(4) The semiconductor light-emitting device fabrication process as recited in any one of (1) to (3) is further characterized in that the recess in the second step is formed by exposing the M or/and A planes of a gallium nitride semiconductor layer.

(5) The semiconductor light-emitting device fabrication process as recited in any one of (1) to (4) is further characterized in that said active layer has a quantum well structure including a well layer comprising an In-containing gallium nitride semiconductor layer.

(6) The semiconductor light-emitting device fabrication process as recited in any one of (1) to (5) is further characterized in that the first electrically conductive type is an n-type and the second electrically conductive type is a p-type.

(7) The semiconductor light-emitting device fabrication process as recited in any one of (1) to (6) is further characterized in that the recess in the second step is preferably formed by etching of the first conduction type layer while an insulating film is formed on a non-etched surface.

(8) The semiconductor light-emitting device fabrication process as recited in any one of (1) to (7) is further characterized in that the second electrically conductive type semiconductor layer in the fourth step is preferably formed contiguously to the active layer in a plane orientation wherein the active layer comes in contact with the first electrically conductive type semiconductor layer.

(9) The semiconductor light-emitting device fabrication process as recited in any one of (1) to (8) is further characterized in that preferably after the fourth step, the second electrically conductive type semiconductor layer and the active layer are etched to expose a part of the first electrically conductive type semiconductor layer, a first electrode is formed on at least a part of the thus exposed surface, and a second electrode is formed on at least a part of the surface of the second electrically conductive type semiconductor layer.

4.0 EXAMPLE

By way of illustration but not by way of limitation, the present invention is now explained with reference to two examples.

A. Example 1

A buffer layer comprising AlGaN is formed at a temperature of 800° C. or lower on a sapphire substrate whose major surface is defined by the C plane and whose orientation flat surface is defined by the A plane. After formation of the buffer layer, GaN is grown in the form of an n-type layer, so that a gallium nitride layer of high crystallinity can be obtained.

Then, a mask is used in such a way as to expose the M plane of the gallium nitride semiconductor to etch the n-type layer by RIE, thereby forming recesses. These recesses are formed in triangular, striped, and continuously corrugated forms, as shown in FIGS. 7, 8 and 9.

After formation of the recesses in the n-type gallium nitride semiconductor layer, a clad layer comprising AlGaN is formed, followed by formation of a multiple quantum well active layer formed of a combined well layer and barrier layer comprising a combination of InGaN with GaN. This active layer could have an outermost layer of either a barrier or a well. After growth of the active layer, the junction interface between the active layer and the p-type gallium nitride semiconductor layer is defined by only the M plane of the gallium nitride semiconductor.

In the gallium nitride semiconductor device with the recesses being all filled up, a p-type gallium nitride semiconductor layer is formed at the recesses. Thereafter, Mg-doped GaN is formed as the second p-type gallium nitride semiconductor layer on the upper surface of the nitride semiconductor device. After formation of the second p-type gallium nitride semiconductor layer, annealing is carried out at a temperature of 600° C. or higher to obtain a p-type layer of low resistance. Then, a light-transmitting p-electrode is formed all over the second p-type gallium nitride semiconductor layer and an n-electrode is formed on an n-type gallium nitride semiconductor layer. The n-electrode could be formed as follows. When the n-type gallium nitride semiconductor layer is etched to form the recesses, a part of the recesses is not formed. Then, the corresponding portion of the semiconductor layer is formed as far as the p-type gallium nitride semiconductor layer, and then etched so that an n-side ohmic electrode can be formed. In this way, a gallium nitride semiconductor light-emitting device having high light emission efficiency can be obtained.

Fundamentally in the present invention, light emissions having different light emission wavelengths or a plurality of colors can be given out of the active layer; however, light approximate to white light may be obtained through mixing of two colors. As an example, yellow light having a light emission wavelength of 570 nm is emitted out of the surface of the active layer in contact with the C plane, and blue light having a light emission wavelength of 460 nm is emitted out of the surface of the active layer in contact with the A plane. In this case, yellow light and blue light are mixed together, leaving the active layer in the form of light approximate to white light.

B. Example 2

As in Example 1, a gallium nitride semiconductor light-emitting device comprising layers from the n-electrode to the p-electrode is obtained. A resin mixture with a YAG-containing fluorescent substance is formed on the surface of the light-emitting device, thereby obtaining a white light-emitting device having high light emission efficiency.

In this example, the wavelength conversion by the fluorescent substance is combined with the aforesaid properties of the nitride semiconductor device, so that white light can more efficiently be obtained. That is, when the active layer is formed on the C and M planes of the nitride semiconductor layer, light from the C plane has a longer wavelength. By use of a fluorescent substance such as one that absorbs the major peak wavelength of light from that C plane and excites a much longer wavelength, however, white light can be obtained through the light emitted from the M plane with a shorter wavelength and the light from the C plane with an excited longer wavelength.

Referring to FIG. 12 as an example, if the well layer in the active layer is composed of $In_{0.5}Ga_{0.5}N$ and the active layer is grown in such a way that the well layer width in the active layer is 10 nm on the C plane and the well layer width in the active layer is 2 nm or less on the M plane, it is then possible to make a light emission wavelength difference of about 570 nm and about 460 nm. In this case, the well layer in the active layer on the C plane is shifted by the piezoelectric field to a longer wavelength side. Similar tendencies hold true for a nitride semiconductor light-emitting device wherein recesses of a triangular shape as viewed from above are formed in such a way as to expose the M and A planes, and the active layer comes in contact with the n-type layer and the p-type layer at the C, A and M planes.

It is here noted that the first electrically conductive type semiconductor layer, and the second electrically conductive type semiconductor layer is not always limited to a single layer or may comprise two or more layers. In this case, the first electrically conductive type semiconductor layer may include a layer that is not contiguous to the active layer.

What we claim is:

1. A semiconductor light-emitting device, comprising:
    a substrate;
    an n-type semiconductor layer formed on the substrate;
    a recess formed on a major surface of the n-type semiconductor layer, the recess having a planar bottom surface with a crystal orientation and planar sidewalls each having a different crystal orientation from the bottom surface;
    an active layer conformably formed on the n-type semiconductor layer such that a portion of the active layer is located within the recess and a portion of the active layer is located outside the recess; and,
    a p-type semiconductor layer formed on the active layer such that a portion of the p-type layer is formed on the portion of the active layer located within the recess, wherein the portion of the p-type layer has a bottom surface having the same crystal orientation as the bottom surface of the recess and sidewalls having the same crystal orientation as the sidewalls of the recess.

2. The semiconductor light-emitting device of claim 1, wherein the p-type semiconductor layer, the n-type semiconductor layer, and the active layer each comprise a gallium nitride layer.

3. The semiconductor light-emitting device of claim 1, wherein the active layer has a quantum well structure including a well layer comprising gallium nitride and indium.

4. The semiconductor light-emitting device of claim 1, wherein at least one surface of the n-type semiconductor layer in contact with the active layer defines the major surface of the n-type semiconductor layer.

5. The semiconductor light-emitting device of claim 1, wherein at least one surface of the n-type semiconductor layer in contact with the active layer is vertical relative to the major surface of the n-type semiconductor layer.

6. The semiconductor light-emitting device of claim 4, wherein the n-type semiconductor layer comprises a gallium nitride layer; and,
    wherein the major surface of the n-type semiconductor layer is a C plane of the gallium nitride layer.

7. The semiconductor light-emitting device of claim 5, wherein the n-type semiconductor layer comprises a gallium nitride layer; and,
    wherein the surface of the n-type semiconductor layer that is vertical relative to the major surface of the n-type semiconductor layer is aligned with an A or M plane of the gallium nitride layer.

8. The semiconductor light-emitting device of claim 7, wherein the active layer comprises a plurality of M or A planes that intersect each other at angles of 30°, 60°, 90°, 120°, 150°, 210°, 240°, 270°, 300° or 330°, as viewed from an upper surface of the n-type semiconductor layer.

9. The semiconductor light-emitting device of claim 7, wherein the active layer has a M or A plane formed in a striped fashion as viewed from an upper surface of the n-type semiconductor layer.

10. The semiconductor light-emitting device of claim 1, further comprising:
    a first electrode formed on a surface of the n-type semiconductor layer exposed by etching the p-type semiconductor layer and the active layer; and
    a second electrode formed on a surface of the p-type semiconductor layer.

11. The semiconductor light-emitting device of claim 1, wherein the active layer emits light components having two or more different major peak wavelengths, and the light components are mixed to produce a color.

12. The semiconductor light-emitting device of claim 1, wherein the recess is one of a plurality of recesses formed in the n-type semiconductor layer and arranged in a repetitively corrugated shape with back-to-back side face angles of 120° and 240°; and,
    wherein each of the plurality of recesses has a bottom surface aligned with the major surface of n-type semiconductor layer and sidewalls having a different crystal orientation from the bottom surface.

13. The semiconductor light-emitting device of claim 1, wherein the n-type semiconductor layer comprises a gallium nitride layer;
    wherein the recess is one of a plurality of stripe-shaped recesses formed in the gallium nitride layer; and,
    wherein each of the plurality of stripe-shaped recesses has a bottom surface aligned with a C-plane of the gallium nitride layer and sidewalls aligned with an M-plane or an A-plane of the gallium nitride layer.

14. The semiconductor light-emitting device of claim 1, wherein the recess is one of a plurality of triangle shaped recesses formed in the n-type semiconductor layer, as viewed from an upper surface of the n-type semiconductor layer.

* * * * *